United States Patent
Im

(10) Patent No.: US 7,341,928 B2
(45) Date of Patent: Mar. 11, 2008

(54) SYSTEM AND PROCESS FOR PROCESSING A PLURALITY OF SEMICONDUCTOR THIN FILMS WHICH ARE CRYSTALLIZED USING SEQUENTIAL LATERAL SOLIDIFICATION TECHNIQUES

(75) Inventor: James S. Im, New York, NY (US)

(73) Assignee: The Trustees Of Columbia University In The City Of New York, New York, NY (US)

( * ) Notice: Subject to any disclaimer, the term of this patent is extended or adjusted under 35 U.S.C. 154(b) by 377 days.

(21) Appl. No.: 10/544,498

(22) PCT Filed: Feb. 18, 2004

(86) PCT No.: PCT/US2004/004929

§ 371 (c)(1),
(2), (4) Date: Aug. 3, 2005

(87) PCT Pub. No.: WO2004/075263

PCT Pub. Date: Sep. 2, 2004

(65) Prior Publication Data

US 2006/0134890 A1 Jun. 22, 2006

Related U.S. Application Data

(60) Provisional application No. 60/448,713, filed on Feb. 19, 2003.

(51) Int. Cl.
*H01L 21/36* (2006.01)
*H01L 21/20* (2006.01)

(52) U.S. Cl. .................. 438/487; 117/44; 117/904; 257/E21.134; 438/795

(58) Field of Classification Search .............. 117/44, 117/904; 257/E21.134; 438/487, 795
See application file for complete search history.

(56) References Cited

U.S. PATENT DOCUMENTS 3,632,205 A 1/1972 Marcy (Continued)

FOREIGN PATENT DOCUMENTS

EP 681316 8/1995

(Continued)

OTHER PUBLICATIONS

U.S. Appl. No. 60/253,256, filed Aug. 31, 2003, Im.

(Continued)

*Primary Examiner*—Asok Kumar Sarkar
(74) *Attorney, Agent, or Firm*—Baker Botts L.L.P

(57) ABSTRACT

A process and system are provided for processing at least one section of each of a plurality of semiconductor film samples. In these process and system, the irradiation beam source is controlled to emit successive irradiation beam pulses at a predetermined predetermined repetition rate. Using such emitted beam pulses, at least one section of one of the semiconductor film samples is irradiated using a first sequential lateral solidification ("SLS") technique and/or a first uniform small grained material ("UGS") techniques to process the such sections) of the first sample. Upon the completion of the processing of this section of the first sample, the beam pulses are redirected to impinge at least one section of a second sample of the semiconductor film samples. Then, using the redirected beam pulses, such sections) of the second sample are irradiated using a second SLS technique and/or a second UGS technique to process the at least one section of the second sample. The first and second techniques can be different from one another or substantially the same.

16 Claims, 5 Drawing Sheets

U.S. PATENT DOCUMENTS

| | | | |
|---|---|---|---|
| 4,234,358 A | 11/1980 | Celler et al. | |
| 4,309,225 A | 1/1982 | Fan et al. | |
| 4,382,658 A | 5/1983 | Shields et al. | |
| 4,456,371 A | 6/1984 | Lin | |
| 4,639,277 A | 1/1987 | Hawkins | |
| 4,691,983 A | 9/1987 | Kobayashi et al. | |
| 4,727,047 A | 2/1988 | Bozler et al. | |
| 4,758,533 A | 7/1988 | Magee et al. | |
| 4,793,694 A | 12/1988 | Liu | |
| 4,800,179 A | 1/1989 | Mukai | |
| 4,855,014 A | 8/1989 | Kakimoto et al. | |
| 4,870,031 A | 9/1989 | Sugahara et al. | |
| 4,940,505 A | 7/1990 | Schachameyer et al. | |
| 4,970,546 A | 11/1990 | Suzuki et al. | |
| 4,977,104 A | 12/1990 | Sawada et al. | |
| 5,032,233 A | 7/1991 | Yu et al. | |
| 5,061,655 A | 10/1991 | Ipposhi et al. | |
| RE33,836 E | 3/1992 | Resor, III et al. | |
| 5,145,808 A | 9/1992 | Sameshima et al. | |
| 5,204,659 A | 4/1993 | Sarma | |
| 5,233,207 A | 8/1993 | Anzai | |
| 5,285,236 A | 2/1994 | Jain | |
| 5,291,240 A | 3/1994 | Jain | |
| 5,304,357 A | 4/1994 | Sato et al. | |
| 5,373,803 A | 12/1994 | Noguchi et al. | |
| 5,395,481 A | 3/1995 | McCarthy | |
| 5,409,867 A | 4/1995 | Asano | |
| 5,453,594 A | 9/1995 | Konecny | |
| 5,456,763 A | 10/1995 | Kaschmitter et al. | |
| 5,496,768 A | 3/1996 | Kudo | |
| 5,523,193 A | 6/1996 | Nelson | |
| 5,529,951 A | 6/1996 | Noguchi et al. | |
| 5,591,668 A | 1/1997 | Maegawa et al. | |
| 5,721,606 A | 2/1998 | Jain | |
| 5,742,426 A | 4/1998 | York | |
| 5,756,364 A | 5/1998 | Tanaka et al. | |
| 5,766,989 A | 6/1998 | Maegawa et al. | |
| 5,844,588 A | 12/1998 | Anderson | |
| 5,861,991 A | 1/1999 | Fork | |
| 5,893,990 A | 4/1999 | Tanaka | |
| 5,986,807 A | 11/1999 | Fork | |
| 6,014,944 A | 1/2000 | Russell et al. | |
| 6,072,631 A | 6/2000 | Guenther et al. | |
| 6,081,381 A | 6/2000 | Shalapenok et al. | |
| 6,117,752 A | 9/2000 | Suzuki | |
| 6,120,976 A | 9/2000 | Treadwell et al. | |
| 6,130,009 A | 10/2000 | Smith et al. | |
| 6,130,455 A | 10/2000 | Yoshinouchi | |
| 6,156,997 A | 12/2000 | Yamazaki et al. | |
| 6,162,711 A | 12/2000 | Ma et al. | |
| 6,169,014 B1 | 1/2001 | McCulloch | |
| 6,172,820 B1 | 1/2001 | Kuwahara | |
| 6,177,301 B1 | 1/2001 | Jung | |
| 6,187,088 B1 | 2/2001 | Okumura | |
| 6,190,985 B1 | 2/2001 | Buynoski | |
| 6,193,796 B1 | 2/2001 | Yang | |
| 6,203,952 B1 | 3/2001 | O'Brien et al. | |
| 6,235,614 B1 | 5/2001 | Yang | |
| 6,242,291 B1 | 6/2001 | Kusumoto et al. | |
| 6,285,001 B1 | 9/2001 | Fleming et al. | |
| 6,300,175 B1 | 10/2001 | Moon | |
| 6,313,435 B1 | 11/2001 | Shoemaker et al. | |
| 6,316,338 B1 | 11/2001 | Jung | |
| 6,320,227 B1 | 11/2001 | Lee et al. | |
| 6,322,625 B2 | 11/2001 | Im | |
| 6,326,286 B1 | 12/2001 | Park et al. | |
| 6,326,665 B1 | 12/2001 | Park et al. | |
| 6,333,232 B1 | 12/2001 | Kunikiyo | |
| 6,368,945 B1 | 4/2002 | Im | |
| 6,388,146 B1 | 5/2002 | Onishi et al. | |
| 6,407,012 B1 | 6/2002 | Miyasaka et al. | |
| 6,444,506 B1 | 9/2002 | Kusumoto et al. | |
| 6,468,845 B1 | 10/2002 | Nakajima et al. | |
| 6,495,067 B1 | 12/2002 | Ono | |
| 6,511,718 B1 | 1/2003 | Paz de Araujo et al. | |
| 6,521,492 B2 | 2/2003 | Miyasaka et al. | |
| 6,526,585 B1 | 3/2003 | Hill | |
| 6,528,359 B2 | 3/2003 | Kusumoto et al. | |
| 6,555,449 B1 | 4/2003 | Im et al. | |
| 6,563,077 B2 | 5/2003 | Im | |
| 6,573,531 B1 | 6/2003 | Im et al. | |
| 6,582,827 B1 | 6/2003 | Im | |
| 6,621,044 B2 | 9/2003 | Jain et al. | |
| 6,635,554 B1 | 10/2003 | Im et al. | |
| 6,830,993 B1 | 12/2004 | Im et al. | |
| 2001/0001745 A1 | 5/2001 | Im et al. | |
| 2001/0041426 A1 | 11/2001 | Im | |
| 2002/0104750 A1 | 8/2002 | Ito | |
| 2003/0029212 A1 | 2/2003 | Im | |
| 2003/0096489 A1 | 5/2003 | Im et al. | |
| 2003/0119286 A1 | 6/2003 | Im et al. | |
| 2004/0053450 A1 | 3/2004 | Sposili et al. | |
| 2004/0061843 A1 | 4/2004 | Im | |
| 2005/0032249 A1 | 2/2005 | Im et al. | |
| 2005/0034653 A1 | 2/2005 | Im et al. | |

FOREIGN PATENT DOCUMENTS

| | | |
|---|---|---|
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 4033327 | 2/1992 |
| JP | 6252048 | 9/1994 |
| JP | 6283422 | 10/1994 |
| JP | 7176757 | 7/1995 |
| JP | 11064883 | 3/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | 02031869 | 4/2002 |
| WO | 0242847 | 5/2002 |
| WO | 02086954 | 5/2002 |
| WO | 02086955 | 10/2002 |
| WO | 03018882 | 3/2003 |
| WO | 03046965 | 6/2003 |
| WO | 04075263 | 8/2003 |
| WO | 03084688 | 10/2003 |
| WO | 04017379 | 2/2004 |
| WO | 04017380 | 2/2004 |
| WO | 04017381 | 2/2004 |
| WO | 04017382 | 2/2004 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).

Crowder et al., "Low-Temperature Single-Crystal Si TFT's Fabricated on Si Films processed via Sequential Lateral Solidification", IEEE Electron Device Letter, vol. 19 (8), p. 306 (1998).

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.

C. E. Nebel, "Laser Interference Structuring of A-Sl:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH, Jun. 1997.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliabilty," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COference on Polycrystalline Semiconductors, Schwabisch Gmund, Germany, Sep. 13-18, 1998, vol. 67-68, pp. 175-180.

Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Are Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Letts., vol 64 (17), p. 2303 (1994).

Brochure from MicroLas Lasersystem, GmbH, "UV Optics Systems for Excimer Laser Based Micromaching and Marking", Jun. 1997.

Ishida et al., "Ultra-shallow boxlike profiles fabricated by pulsed ultraviolet-laser doping process", J. Vac. Sci. Technol. B 12(1), p. 399-403, 1994, no month.

Yoshimoto, et al., "Excimer-Laser-Produced and Two-Dimensionally Position-Controlled Giant Si Grains on Organic SOG Underlayer", p. 285-286, AM-LCD 2000, no month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999), no month.

I.W. Boyd, Laser Processing of Thin Films and Microstructures, Oxidation, Deposition, and Etching of Insulators (Springer—Verlag Berlin Heidelber 1987).

N. Yamamuchi and R. Reif, J., "Polycrystalline silicon thin films processed with silicon ion implantation and subsequent solid-phase crystallization: Theory, experiments, and thin-film transistor applications," Appl. Phys 75 (1994) 3235.

T. Noguchi, "Appearance of Single-Crystalline Properties in Fine-Patterned Si Thin Film Transistors (TFTs) by Solid Phase Crystallization (SPC)," Jpn. Appl. Phys. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.

SYSTEM AND PROCESS FOR PROCESSING A PLURALITY OF SEMICONDUCTOR THIN FILMS WHICH ARE CRYSTALLIZED USING SEQUENTIAL LATERAL SOLIDIFICATION TECHNIQUES

CROSS-REFERENCE TO RELATED APPLICATIONS

This application is a national phase of International Application PCT/US04/004929, filed Feb. 18, 2004, published Sept. 2, 2004, which claims priority from U.S. Provisional Application Ser. No. 60/448,713, filed Feb. 19, 2003, each of which are incorporated by reference in their entireties herein, and from which priority is claimed.

FIELD OF THE INVENTION

The present invention relates to a system and process for processing a plurality of semiconductor thin films (such as silicon thin films) using a pulse energy beam. In particular, one exemplary embodiment of the system and process utilizes a pulsed beam in conjunction with a sequential lateral solidification ("SLS") technique to irradiate at least two semiconductor thin films, without stopping the emission of energy the pulsed beam. Another exemplary embodiment of the system and process also uses a pulsed beam to irradiate sections of the film such that the areas that have been irradiated and resolidified which have small-grains therein do not overlap one another, and can be used to place therein thin film transistor ("TFT") devices.

BACKGROUND INFORMATION

Semiconductor films, such as silicon films, are known to be used for providing pixels for liquid crystal display devices. Such films have previously been processed (i.e., irradiated by an excimer laser and then crystallized) via excimer laser annealing ("ELA") techniques. However, the semiconductor films processed using such known ELA methods often suffer from microstructural non-uniformities such as edge effects, which manifest themselves in availing a non-uniform performance of thin-film transistor ("TFT") devices fabricated on such films. In addition, it may take approximately 200 second to 600 seconds to completely process the semiconductor film sample using the ELA techniques, without even taking into consideration the time it takes to load and unload such sample.

Other more advantageous processes and systems for processing the semiconductor thin films for use in the liquid crystal displays and organic light emitting diode displays for fabricating large grained single crystal or polycrystalline silicon thin films using sequential lateral solidification ("SLS") techniques have been described. For example, U.S. Pat. Nos. 6,322,625 and 6,368,945 issued to Dr. James Im, and U.S. patent application Ser. Nos. 09/390,535 and 09/390,537, the entire disclosures of which are incorporated herein by reference, and which are assigned to the common assignee of the present application, describe such SLS systems and processes. These patent documents describe certain techniques in which one or more areas on the semiconductor thin film are, e.g., sequentially irradiated. One of the benefits of these SLS techniques is that the semiconductor film sample and/or sections thereof can be processed (e.g., crystallized) much faster that it would take for the processing the semiconductor film by the conventional ELA techniques. Typically, the processing/crystallization time of the semiconductor film sample depends on the type of the substrates, as well as other factors. For example, it is possible to completely process/crystallize the semiconductor film using the SLS techniques in approximately 50 to 100 seconds not considering the loading and unloading times of such samples.

In order to uniformly process the semiconductor films, it is important for the beam pulse to be stable. Thus, to achieve the optimal stability, it is preferable to pulse or fire the beam constantly, i.e., without stopping the pulsing of the beam. Such stability may be reduced or compromised when the pulsed beams are turned off or shut down, and then restarted. However, when the semiconductor sample is loaded and/or unloaded from a stage, the pulsed beam would be turned off, and then turned back on when the semiconductor sample to be processed was positioned at the designated location on the stage. The time for loading and unloading is generally referred to as a "transfer time." The transfer time for unloading the processed sample from the stage, and then loading another to-be-processed sample on the stage is generally the same when for the ELA techniques and the SLS techniques. Such transfer time can be between 50 and 100 seconds.

In addition, the costs associated with processing semiconductor samples are generally correlated with the number of pulses emitted by the beam source. In this manner, a "price per shot/pulse" is established. If the beam source is not shut down (i.e., still emit the beam pulses) when the next semiconductor sample is loaded unto the stage, or unloaded from the stage, the number of such irradiations by the beam source when the sample is not being irradiated by the beam pulse and corresponding time therefore is also taken into consideration for determining the price per shot. For example, when utilizing the SLS techniques, the time of the irradiation, solidification and crystallization of the semiconductor sample is relatively short as compared to the sample processing time using the ELA techniques. In such case, approximately half of the beam pulses are not directed at the sample since such samples are being either loaded into the stage or unloaded from the stage. Therefore, the beam pulses that are not impinging the samples are wasted.

Another exemplary technique for processing semiconductor thin film has been developed. In particular, such system and process can produce generally uniform areas on the substrate films such that the TFT devices can be situated in such areas. For example, portions of the irradiated film are irradiated, then nucleated (based on the threshold behavior of the beam pulse), and then solidified, such that upon re-solidification, the nucleated area becomes a region with uniform small grained material (to be referred to herein below as the "UGS techniques"). Thus, such UGS techniques are different from the SLS techniques in that for the SLS-techniques, the nucleated areas are avoided, while for the UGS techniques, the nucleated areas are utilized for placing the TFT devices therein. Indeed, using the UGS technique, there can be significant time savings since each irradiated area of the semiconductor thin film is irradiated once, without the need to re-irradiate a substantial portion thereof, while still providing a good uniform material therein. Many of these UGS techniques are described in U.S. Patent Application Serial Nos. 60/405,084, 60/405,083 and 60/405,085, and International Applications PCT/US03/25946, PCT/US03/25972 and PCT/US03/25954, the entire disclosures of which are incorporated herein by reference.

Accordingly, it is preferable to reduce the price per shot, without stopping the emission of the beam pulses. It is also preferable to be able to process two or more semiconductor samples, without the need to stop or delay the emission of the pulsed beam by the beam source until the samples are loaded on the respective stages.

SUMMARY OF THE INVENTION

To achieve at least some of these objects, various systems and process according to the present invention are described below which can be utilized to, e.g., sequentially process a semiconductor (e.g., silicon) thin film sample (i.e., by irradiating and melting thin film of the sample, and allowing melted portions thereof to solidify and crystallize) on one stage, while unloading a previously-processed sample from another stage, and then loading an unprocessed sample thereon, without the need to shut down a pulsed beam. The exemplary embodiments of the systems and process for processing the samples in this manner shall be described in further detail below. However, it should be understood that the present invention is in no way limited to the exemplary embodiments of the systems and processes described herein.

One such exemplary embodiment of the process and system according to the present invention is provided for processing at least one section of each of a plurality of semiconductor film samples. With these process and system, the irradiation beam source can be controlled to emit successive irradiation beam pulses at a predetermined repetition rate. Using such emitted beam pulses, at least one section of one of the semiconductor film samples may be irradiated using at least one first sequential lateral solidification ("SLS") technique and/or at least one first uniform small grained material ("UGS") technique so as to process such section(s) of the first sample. Upon the completion of the processing of the section(s) of the first sample, the beam pulses can be redirected to impinge at least one section of a second sample of the semiconductor film samples. Then, using the redirected beam pulses, such section(s) of the second sample is irradiated using at least one second SLS technique and/or at least one second UGS technique to process the section(s) of the second sample. The first and second SLS and/or UGS techniques can be different from one another, or may be substantially the same.

According to another exemplary embodiment of the present invention, the second sample can be is an unprocessed sample. The first sample can be loaded on a stage of a first chamber, and the second sample may be loaded on a stage of the second chamber. In addition, during the irradiation of the first sample, a third sample of the film samples that was previously irradiated and processed using the first SLS/UGS technique(s) and/or the second SLS/UGS technique(s) can be unloaded from the stage of the second chamber. Then, the second sample may be loaded unto the stage of the second chamber.

In yet another exemplary embodiment of the present invention, during the irradiation of the second sample, the first sample can be unloaded from the stage of the first chamber. Thereafter and during the irradiation of the second sample, a fourth unprocessed sample of the film samples may be loaded unto the stage of the first chamber. Upon the completion of the loading of the fourth sample, the beam pulse may again be redirected to impinge the section(s) of the fourth sample. After such redirection, such section(s) of the fourth sample can be irradiated using the first SLS/UGS technique(s) and/or the second SLS/UGS technique(s) so as to process the section(s) of the fourth sample.

According to still another exemplary embodiment of the present invention, the beam pulses can be redirected using a beam redirecting arrangement which may include a beam reflection device. Further, if is determined that the second sample has not been successfully loaded unto the stage of the second chamber, the irradiation of the second sample can be prevented or delayed until the second sample is successfully loaded unto the stage of the second chamber. If it is determined that the entire section(s) of the first sample was/were not successfully processed, the irradiation of the second sample can be prevented or delayed until the processing of all of the section(s) of the first sample has/have been successfully processed.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION

Certain systems and processes for providing continuous motion SLS are described in U.S. Pat. Nos. 6,322,625 and 6,368,945 and U.S. patent application Ser. Nos. 09/390,535 and 09/390,537. In addition, systems and processes for providing uniform small grained materials ("UGS") techniques are described in U.S. Patent Application Serial Nos. 60/405,084, 60/405,083 and 60/405,085, and International Applications PCT/US03/25946, PCT/US03/25972 and PCT/US03/25954. Exemplary systems and processed according to the present invention can employ principles and components thereof to sequentially process a thin film of each of two or more semiconductor samples In particular, the system and process according to the present invention can be used to process two or more samples (provided on distinct stages). Each of the sample has an amorphous silicon thin film provided thereon.

Figure 1:
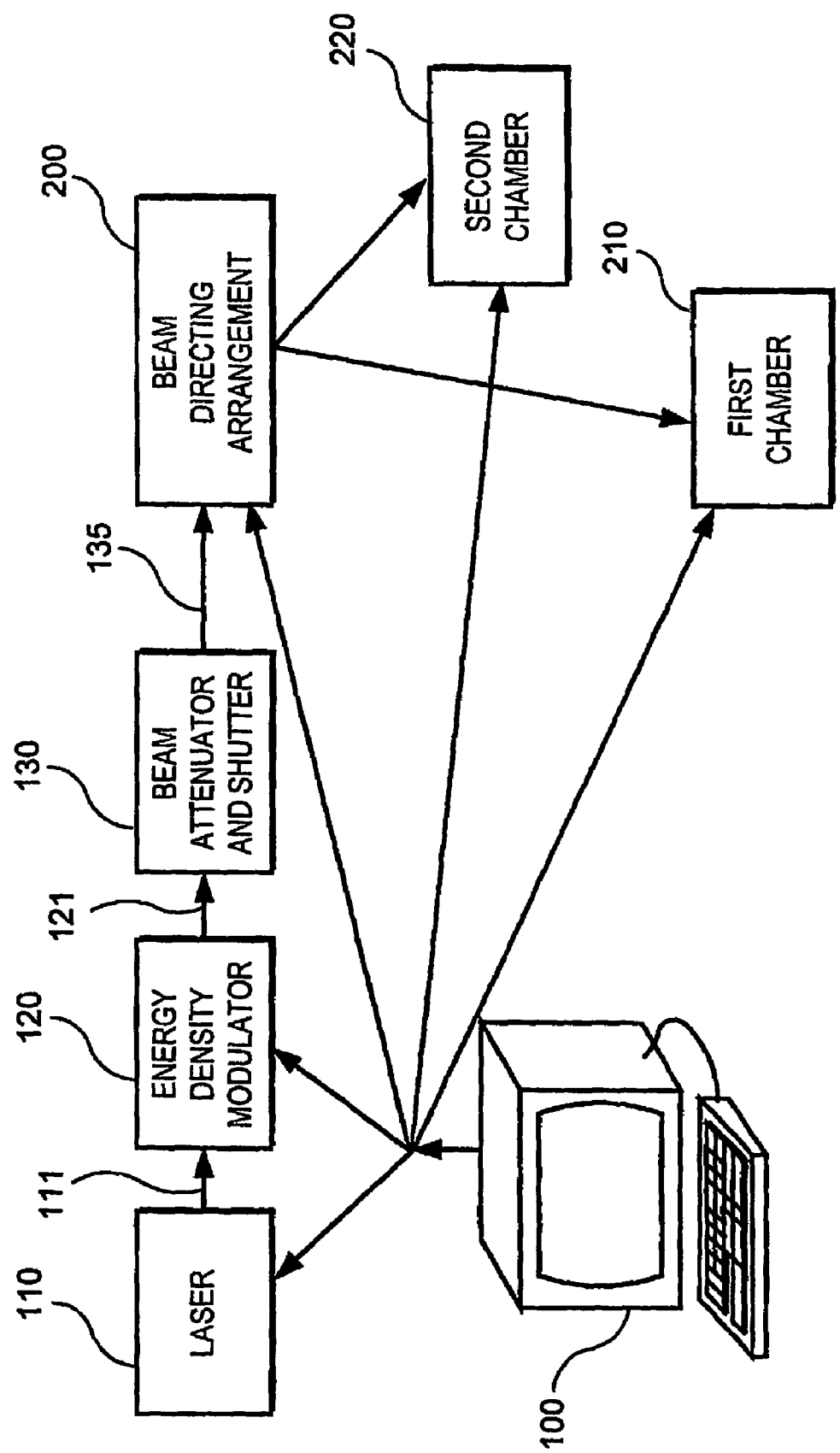
FIG. 1 is a schematic block diagram of an exemplary embodiment of a sequential-lateral solidification ("SLS") and/or uniform small grained material ("UGS") processing system according to the present invention which processes semiconductor samples, sequentially, in two or more chambers using a beam directing arrangement.

In particular, as shown in FIG. 1, an exemplary embodiment of the system according to the present invention may include a beam source 110 (e.g., a Lambda Physik model LPX-315I XeCl pulsed excimer laser) emitting a pulsed irradiation beam (e.g., a laser beam), a controllable beam energy density modulator 120 for modifying the energy density of the irradiation beam, and a MicroLas two plate variable attenuator 130 (e.g., from MicroLas). It should be understood by those skilled in the art that instead of the beam source 110 (e.g., the pulsed excimer laser), it is possible to use a pulsed solid state laser, a chopped continuous wave laser, a pulsed electron beam and a pulsed ion beam, etc. Typically, the radiation beam pulses 111 generated by the beam source 110 provide a beam intensity in the range of 10 mJ/cm$^2$ to 1 J/cm$^2$, a pulse duration (FWHM) in the range of 10 to 300 nsec, and a pulse repetition rate in the range of 10 Hz to 300 Hz. The modulated beam pulses 135 exiting a beam attenuator and shutter 130 can be provided to a beam directing arrangement 200, which further directs the pulsed beam either to a first chamber 210 or to a second chamber 220. Exemplary details of such chambers 210, 220 shall be described below in further detail, with reference to FIG. 2.

Each of the first and second chambers 210, 220 is configured to be able to load therein the semiconductor sample prior to the thin film (or portion thereof) of such sample being irradiated and melted by the pulsed beam, solidified and then crystallized using one or more sequential lateral solidification ("SLS ") and/or uniform small grained materials ("UGS") techniques. In addition, upon the completion of such processing of the semiconductor sample, each of these chambers 210, 220 can be configured to remove the SLS/UGS-processed sample therefrom, and load another unprocessed sample after the previously SLS-processed sample is removed.

The exemplary embodiment of the system illustrated in FIG. 1 also includes a processing arrangement 100 (e.g., a computer which includes a microprocessor executing instructions thereon, such as those implemented by software stored on its storage device or which is provided remotely therefrom). This processing arrangement 100 is communicably coupled to the beam source 110, the energy density modulator 120, and the beam attenuator and shutter 130. In this manner, the processing arrangement 100 can control the rate of the pulse of the beam being emitted by the beam source 110. The processing arrangement 100 can also control the repetition of the pulsed beam, as well as its modulation and attenuation (e.g., using arrangements 120, 130).

The processing arrangement 100 is further communicably coupled to the beam directing arrangement 200, the first chamber 210 and the second chamber 220. Such coupling by the processing arrangement 100 to first chamber 210 and the second chamber 220 provides information to the processing arrangement regarding whether the entire sample in the respective chamber has been completely crystallized using the particular SLS and/or UGS technique, if the previously processed sample has been unloaded from the chamber, and if the unprocessed sample has been loaded into such chamber. In addition, the processing arrangement 100 can control the loading and unloading of the sample into the chambers 210, 220.

With such information, the processing arrangement 100 can control the beam directing arrangement 200 to selectively direct the pulsed beam 135 toward the first chamber 210 or the second chamber, depending on the information obtained by the processing arrangements 100 from these chambers 210, 220. The details of the control by the processing arrangement 100 of the beam directing arrangement 200 based on such information shall be described in further detail below.

In exemplary operation of the system and process according to the present invention, the SLS and/or UGS processing of the sample in the first chamber 210 can be performed under the control of the processing arrangement 100 such that the pulsed beam 135 is provided by the beam directing arrangement 200 to the first chamber 210 so as to irradiate and crystallize the semiconductor sample therein. During such SLS-processing of the sample in the first chamber 210, the previously SLS-processed sample situated in the second chamber 220 is unloaded also under the control and direction of the processing arrangement 100, and a different, previously-unprocessed sample is loaded into this second chamber 220.

Upon the completion of the SLS and/or UGS processing of the sample in the first chamber 210, the processing arrangement 100 determines if the new unprocessed sample has been properly loaded into the second chamber 220 (e.g., unto a stage thereof). If that is the case, the processing arrangement 100 controls the beam directing arrangement 200 to direct the pulsed beam 135 toward the second chamber 220 so as to SLS-process and/or UGS-process the new sample that has been loaded into the second chamber 220. When the SLS-processing of this sample in the second chamber 220 is commenced, the processing arrangement 100 controls the first chamber 210 (e.g., a stage thereof) to unload the SLS/UGS-processed sample therefrom, and then load another yet-unprocessed semiconductor sample into the first chamber 210. In this manner, while one sample is being processed in one chamber, another unprocessed sample is loaded to a further chamber to be SLS/UGS-processed immediately or shortly thereafter.

As described above, this exemplary procedure is effectuated, without shutting down the beam source 110, by re-directing the beam from the previously irradiated chamber to another chamber which has loaded therein the unprocessed sample so as to subsequently SLS/UGS-process such sample. This exemplary procedure continues until it is determined (either by the processing arrangement 100 and/or manually by an operator of the system) that the intended samples have been SLS/UGS-processed. At that time, the beam source 110 is shut down, and the loading/unloading of the samples in the first and second chambers 210, 220 can be stopped.

In this manner, the pulsed beam 135 is operated until all intended samples have been SLS-processed, without being shut down between the processing of the subsequent samples. Therefore, due to the fact the pulsed beam is not shut down by the beam source 110, such beam can be pulsed or shot continuously, and its stability would not be compromised. In addition, the loading and unloading time within of one chamber can be used to process a further semiconductor sample in another chamber so as to continuously process the samples in the chambers, and thus the price-per-shot achieved with these system and process of the present invention may be significantly smaller that the price-per-shot effectuated by the conventional systems.

Figure 2:
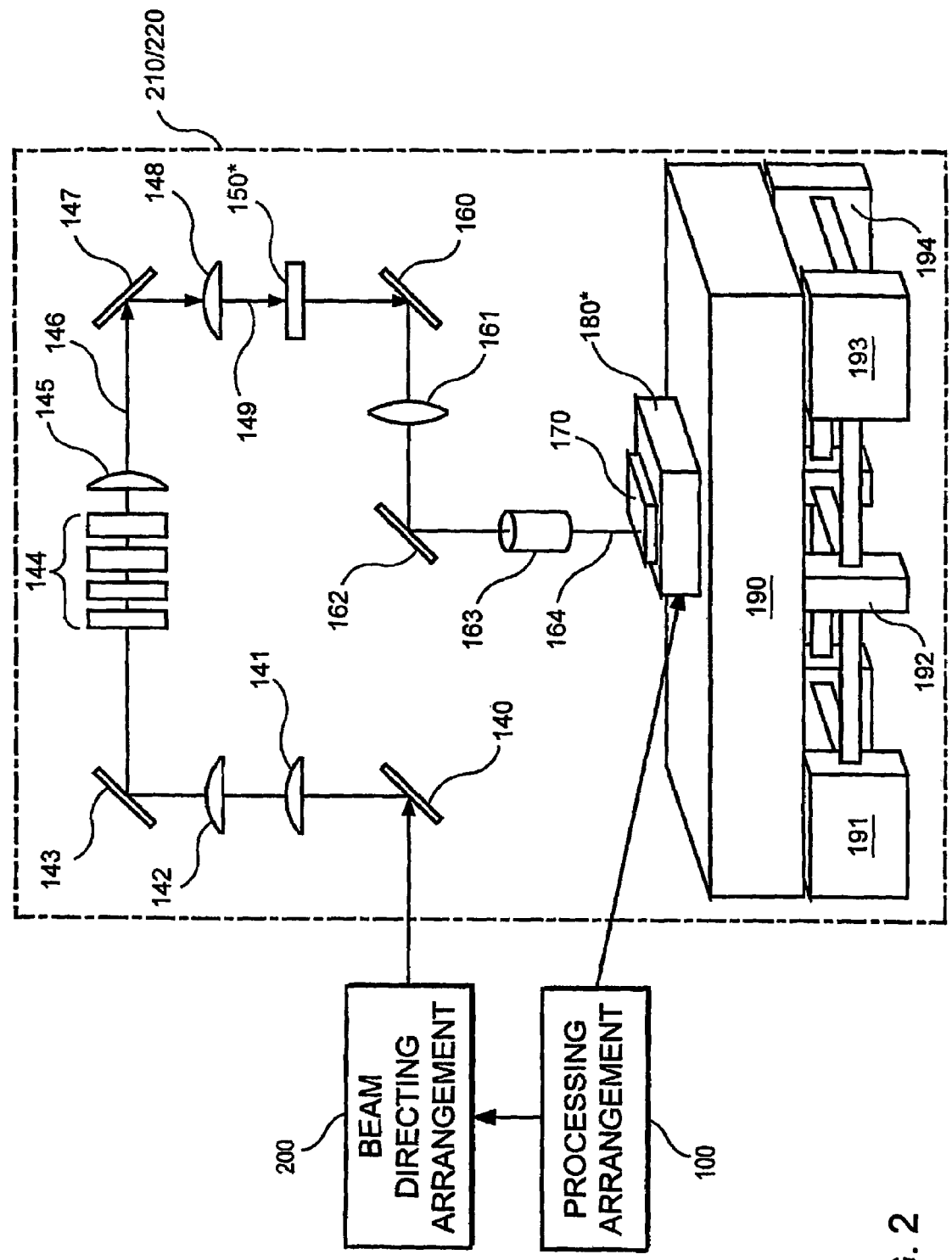
FIG. 2 is a detailed illustration of an exemplary embodiment of one or more chambers shown in FIG. 1.

FIG. 2 shows a detailed illustration of an exemplary embodiment of at least one of the chambers 210, 220 that are provided in FIG. 1. In particular, the exemplary chamber of FIG. 2 includes beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), a 4×-6× eye piece 161, a controllable shutter 152, a multi-element 4×-6× objective lens 163 for focusing a radiation beam pulse 164 onto the sample 170 having the semiconductor thin film to be processed mounted on a sample translation stage 180, and a granite block optical bench 190 supported on a vibration isolation and self-leveling system 191, 192, 193 and 194. The pulsed beam 135 is forwarded toward the chamber and to the beam steering mirror 140 by the beam directing arrangement 200

The computing arrangement 100 is communicably coupled to and the sample translation stage 180. As described in U.S. Pat. Nos. 6,322,625 and 6,368,945, the sample translation stage 180 is preferably controlled by the processing arrangement 100 to effectuate translations of the sample 170 in the planar X-Y directions, as well as in the Z direction. In this manner, the processing arrangement 100 can control the relative position of the sample 170 with respect to the irradiation beam pulse 164 directed at the respective sample 170. In addition, the processing arrangement 100 can control the loading of the sample 170 to the translation stage 180, and unloading thereof from the translation stage 180, in the manner described herein above, and as shall further be described below.

Figure 3:
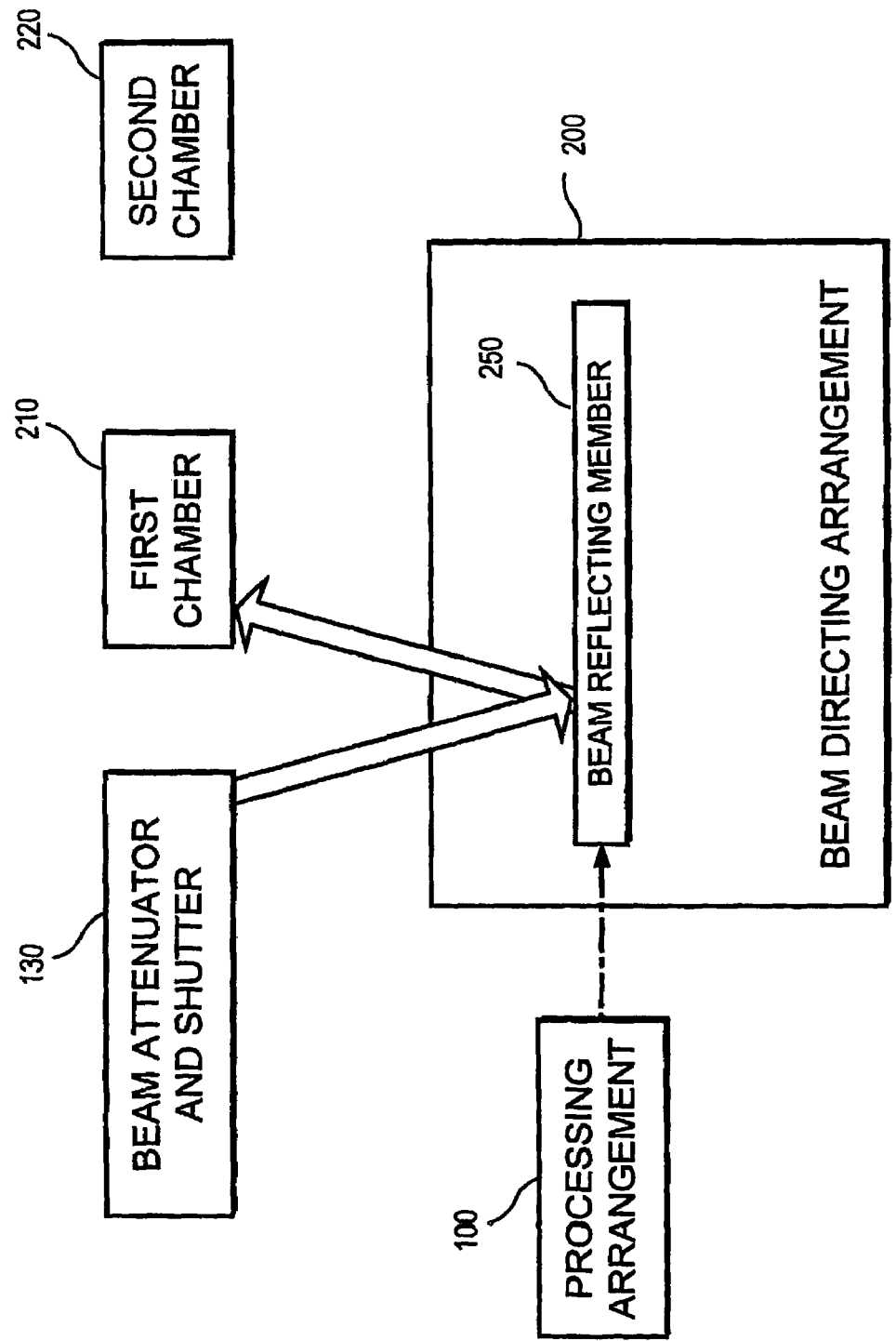
FIG. 3 is a detailed illustration of an exemplary embodiment of the beam directing arrangement of FIG. 1.

FIG. 3 shows a detailed illustration of an exemplary embodiment of the beam directing arrangement 200 of FIG. 1. In particular, the beam directing arrangement 200 is designed so as to selectively direct the pulsed beam 135 toward a particular chamber, e.g., pursuant to the instructions of the processing arrangement 100. As described above, upon the completion of the SLS-processing of the sample 170 in the first chamber 210, the processing arrangement 100 may configure the beam directing arrangement 200 to direct the pulsed beam to the second chamber 220 so as to SLS-process the newly-loaded and previously unirradiated sample 170 that is provided on the translation stage 180 of the second chamber 220.

This can be accomplished by providing a beam reflecting member 250 (e.g., a mirror) in the beam directing arrangement 200 so that it would be able to selective control the path of the pulsed beam 135 (based on the instructions of the processing arrangement 100) toward the first chamber 210 or the second chamber 220. It should be understood by those skilled in the art that, either in addition or instead of the beam reflecting member 250, it is also possible to use other mechanical components in the beam directing arrangement 200 to selectively direct the pulsed beam in the manner discussed above.

Figure 4:
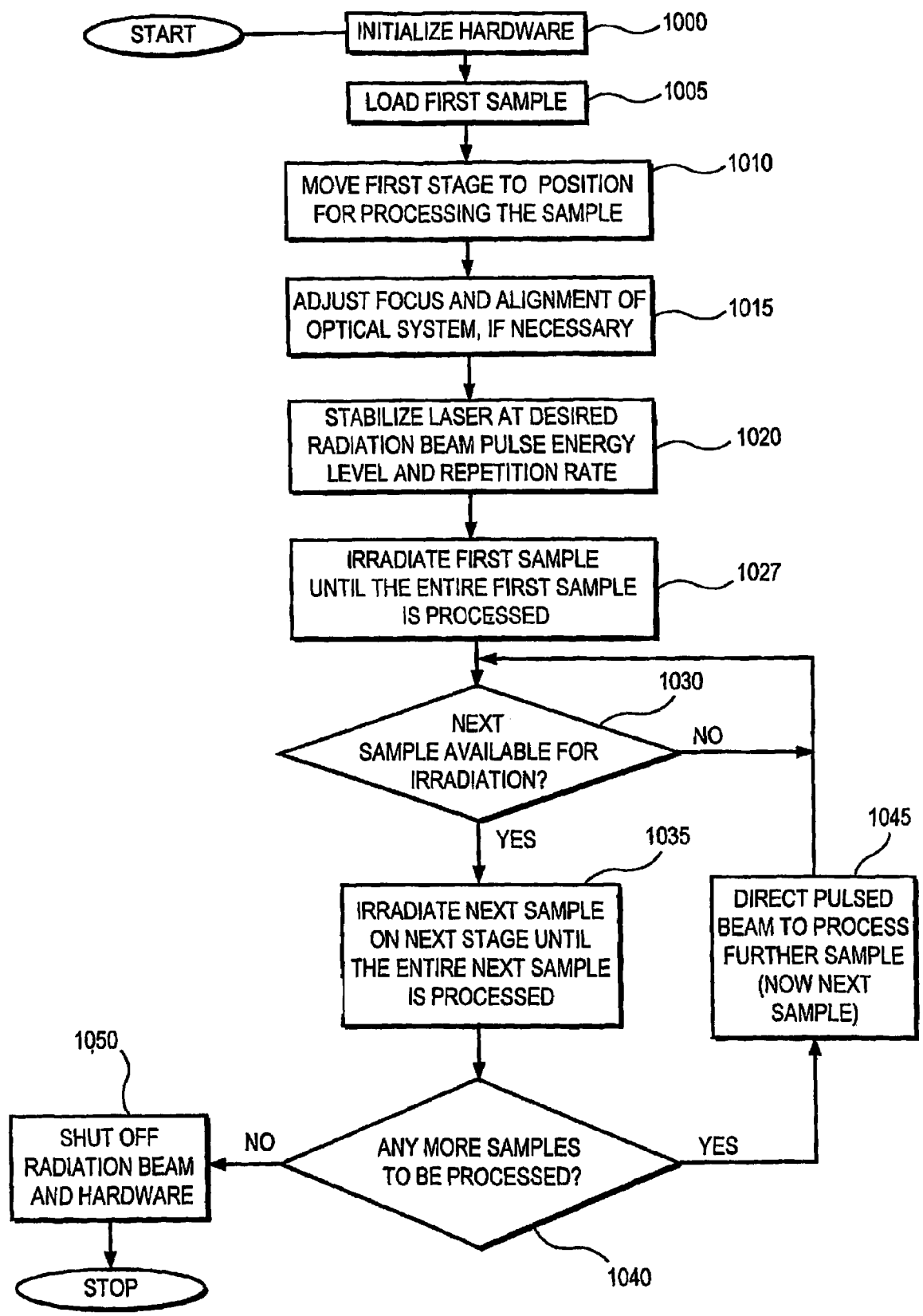
FIG. 4 is a top-level flow diagram of an exemplary embodiment of a process according to the present invention for sequentially SLS-processing or UGS-processing two or more samples, each being provided in its respective chamber.

FIG. 4 shows a top-level flow diagram of an exemplary embodiment of a process according to the present invention for sequentially SLS-processing and/or UGS-processing two or more samples, with each sample being provided in the respective chamber. In step 1000, the hardware components of the system of FIG. 1, such as the beam source 110, the energy beam modulator 120, and the beam attenuator and shutter 130 are first initialized at least in part by the processing arrangement 100. The sample 170 is loaded onto the sample translation stage 180 of the first chamber in step 1005. It should be noted that such loading may be performed either manually or automatically using known sample loading apparatuses under the control of the processing arrangement 100. Next, the sample translation stage 180 of the first chamber 210 can be moved, preferably under the control of the computing arrangement 100, to an initial position in step 1010. Various other optical components of one or more of the chambers 210, 220 may be adjusted and/or aligned either manually or under the control of the processing arrangement 100 for a proper focus and alignment in step 1015, if necessary. In step 1020, the irradiation beam 111 can be stabilized at a predetermined pulse energy level, pulse duration and repetition rate.

Then, in step 1027, the entire sample 170 that is provided on the stage 180 of the first chamber 210 is irradiated according to one or more of the SLS-techniques and/or UGS-techniques described in the publications listed above until such sample is completely processed. Then, in step 1030, the processing arrangement 100 determines if the next unprocessed sample is available in the second chamber 220. In particular, it is determined if the next unprocessed sample 170 has been loaded into the translation stage 180 of the second chamber 220. If that is not the case, then the exemplary process according to the present invention waits until the sample 170 is loaded unto the stage 180 of the second chamber 220. Otherwise, in step 1035, the unprocessed sample 170 arranged on the translation stage 180 of the second chamber 220 is irradiated according to one or more of the SLS/UGS-techniques until it is completely processed.

Then, in step 1040, it is determined whether there are any further samples to be SLS-processed and/or UGS-processed. If so, in step 1045, the pulsed beam is directed to process another unprocessed sample that is loaded unto the translation stage 180 of the first chamber 210 (from which the previously SLS/UGS-processed sample has been unloaded), and the process according to the present invention returns to step 1030 for processing such unprocessed sample 170 that is provided in the first chamber 210, as described above. If, in step 1040, it is determined that there are no more samples to be processed, and the hardware components and the beam 111 of the system shown in FIG. 1 can be shut off in step 1050, and this process may be terminated.

Figure 5:
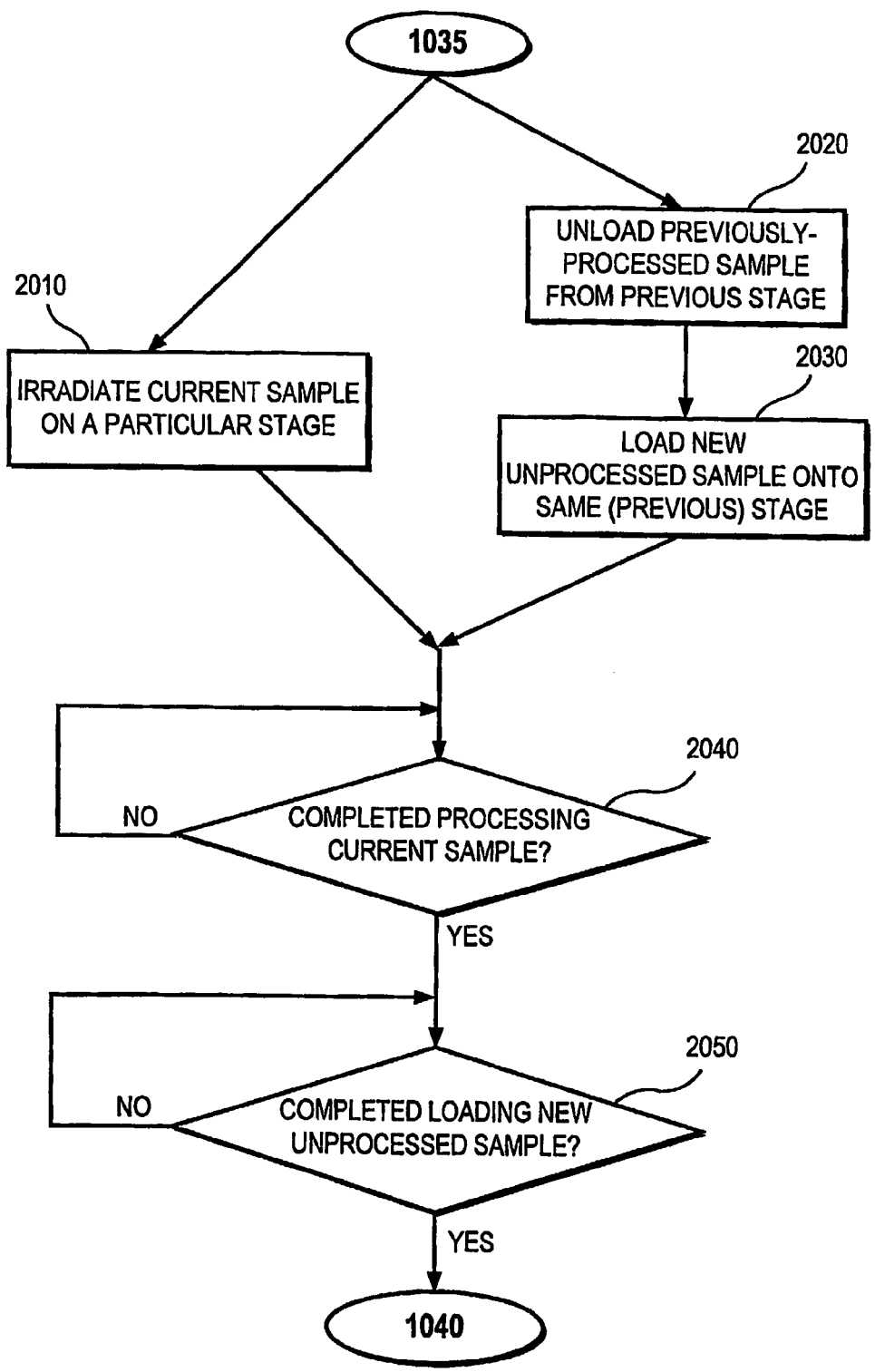
FIG. 5 is a detailed flow diagram of an exemplary embodiment of the process according to the present invention in which one sample on one stage is being processed, while previously SLS-processed or UGS-processed sample is removed from another stage and an unprocessed sample is loaded thereon.

FIG. 5 shows a detailed flow diagram of an exemplary embodiment of step 1035 of the process according to the present invention in which the sample 170 provided on one translation stage 170 of a particular chamber (e.g., the second chamber 220) is being SLS/UGS-processed, while previously SLS-processed sample 170 is unloaded from the translation stage 180 of another chamber (e.g., the first chamber 210), and an unprocessed sample is loaded thereon. In particular, while the sample 170 (provided in the second chamber 220) is being irradiated to be completely SLS/UGS-processed in step 2010, the previously SLS/UGS-processed sample 170 of the first chamber 210 is unloaded from this chamber 210 (step 2020), and then another unprocessed sample 170 is loaded unto the translation stage 180 of the first chamber 210 (step 2030). Step 2010 is preferably performed contemporaneously (or at least in the same time period) as steps 2020 and 2030.

Thereafter, it is determined, in step 2040, whether the SLS/UGS-processing of the sample 170 provided in the second chamber 220 being irradiated in step 2010 has been completed. If not, the process according to the present invention (preferably under the control of the processing arrangement 100) waits until the processing of such sample 170 is completed in the second chamber 220. Otherwise, it is determined, in step 2050, whether the new unprocessed sample 170 is loaded onto the translation stage 180 of the first chamber 210. If such unprocessed sample 170 has not yet been loaded, the pulsed beam is provided away from the completely SLS/UGS-processed sample 170 that is arranged in the second chamber 220 with the aid of the beam directing arrangement 200, and under the control of the processing arrangement 100. This is performed without the need to shut down the beam source 110, thus not compromising the stability of the pulsed beam 135, 164. If it is determined that the unprocessed sample 170 has been loaded onto the translation stage 180 of the first chamber 210, the process according to the present invention continues to step 1040, directs the pulsed beam (using the beam directing arrangement 200 under the control of the processing arrangement 100) to irradiate and completely SLS-process the unprocessed sample 170 loaded onto the stage 180 of the first chamber 210.

It is to be understood that while the invention has been described in conjunction with the detailed description hereof, the foregoing description is intended to illustrate and not limit the scope of the invention. Other aspects, advantages, and modifications are within the scope of the present invention. In particular, other exemplary embodiments of the system and process according to the present invention can process the samples provided in more than two chambers. For such embodiments, the processing arrangement 100 may control the beam directing arrangement to selectively direct the pulsed beam 135 to each of these chambers when new unprocessed samples are loaded therein.

The foregoing merely illustrates the principles of the invention. Various modifications and alterations to the described embodiments will be apparent to those skilled in the art in view of the teachings herein. For example, while the above embodiment has been described with respect to at least partial lateral solidification and crystallization of the semiconductor thin film, it may apply to other materials processing techniques, such as micro-machining, photo-ablation, and micro-patterning techniques, including those described in International patent application no. PCT/US01/12799 and U.S. patent application Ser. Nos. 09/390,535, 09/390,537 and 09/526,585, the entire disclosures of which are incorporated herein by reference. The various mask patterns and intensity beam patterns described in the above-referenced patent application can also be utilized with the process and system of the present invention. It will thus be appreciated that those skilled in the art will be able to devise numerous systems and methods which, although not explicitly shown or described herein, embody the principles of the invention and are thus within the spirit and scope of the present invention.

What is claimed is:

1. A process for processing at least one section of each of a plurality of semiconductor film samples, comprising the steps of:
   (a) controlling an irradiation beam source to emit successive irradiation beam pulses at a predetermined repetition rate;
   (b) using the emitted beam pulses, irradiating the at least one section of a first sample of the semiconductor film samples using at least one of a first sequential lateral solidification ("SLS") technique and a first uniform small grained material ("UGS") technique to process the at least one section of the first sample;
   (c) upon the completion of step (b), redirecting the beam pulses to impinge the at least one section of a second sample of the semiconductor film samples; and
   (d) using the redirected beam pulses, irradiating the at least one section of the second sample using at least one of a second SLS technique and a second UGS technique to process the at least one section of the second sample, the first and second techniques being one of different from one another and substantially the same.

2. The process according to claim 1, wherein the second sample is an unprocessed sample, wherein, in step (b), the first sample is loaded on a stage of a first chamber, wherein, in step (d), the second sample is provided on a stage of the second chamber.

3. The process according to claim 2, further comprising the steps of:
   (e) during step (b), unloading a third sample of the film samples previously irradiated and processed using at least one of the first and second techniques from the stage of the second chamber; and
   (f) during step (b), after step (e) and before step (d), loading the second sample unto the stage of the second chamber.

4. The process according to claim 3, further comprising the steps of:
   (g) during step (d), unloading the first sample from the stage of the first chamber; and
   (h) during step (d) and after step (g), loading a fourth unprocessed sample of the film samples unto the stage of the first chamber.

5. The process according to claim 4, further comprising the steps of:
   (i) upon the completion of step (h), redirecting the beam pulses to impinge the at least one section of the fourth sample; and
   (j) after step (i) and using the redirected beam pulses, irradiating the at least one section of the fourth sample using at least one of the first and second techniques to process the at least one section of the fourth sample.

6. The process according to claim 3, further comprising the steps of:
   (k) determining if the second sample successfully loaded unto the stage of the second chamber; and
   (l) if step (k) produces an unsuccessful determination, preventing the irradiation of the second sample in step (d) until step (k) produces a successful result.

7. The process according to claim 1, wherein the beam pulses are redirected in step (c) using a beam redirecting arrangement which includes a beam reflection device.

8. The process according to claim 1, further comprising the steps of:
   (m) determining if all of the at least one section of the first sample was successfully processed in step (b); and
   (n) if step (m) produces an unsuccessful determination, preventing the irradiation of the second sample in step (d) until step (k) produces a successful result.

9. A system for processing at least one section of each of a plurality of semiconductor film samples, comprising:
   a processing arrangement which, when executing a set of instruction, is operable to:
   (a) control an irradiation beam source to emit successive irradiation beam pulses at a predetermined repetition rate,
   (b) using the emitted beam pulses, direct the beam pulse to irradiate the at least one section of a first sample of the semiconductor film samples using at least one of a first sequential lateral solidification ("SLS") technique and a first uniform small grained materials("UGS") technique to process the at least one section of the first sample,
   (c) upon the completion of the processing of the at least one section of the first sample, effect a redirection of the beam pulses to impinge the at least one section of a second sample of the semiconductor film samples, and
   (d) direct the redirected beam pulse to irradiate the at least one section of the second sample using at least one of a second SLS technique and a second UGS technique to process the at least one section of the second sample, the first and second techniques being one of different from one another and substantially the same.

10. The system according to claim 9, wherein the second sample is an unprocessed sample, wherein the processing arrangement is operable to load the first sample on a stage of a first chamber, wherein the processing arrangement is operable to load the second sample on a stage of the second chamber.

11. The system according to claim 10, wherein the processing arrangement is further operable to:
   (e) during the irradiation of the first sample, effect an unloading of a third sample of the film samples previously irradiated and processed using at least one of the first and second techniques from the stage of the second chamber, and
   (f) during the irradiation of the first sample and after the unloading of the second sample, effect a loading of the second sample unto the stage of the second chamber.

12. The system according to claim 11, wherein, the processing arrangement is further operable to:
   (g) during the irradiation of the second sample, effecting the unloading the first sample from the stage of the first chamber, and
   (h) during the irradiation of the second sample and after the unloading of the first sample, effect a loading of a fourth unprocessed sample of the film samples unto the stage of the first chamber.

13. The system according to claim 12, wherein the processing arrangement is further operable to:
   (i) upon the completion of the loading of the fourth sample, effecting a redirection of the beam pulse to impinge the at least one section of the fourth sample, and
   (j) after redirecting the beam pulses to impinge the at least one section of the fourth sample, directing the redirected beam pulses to irradiate the at least one section of the fourth sample using at least one of the first and second techniques to process the at least one section of the fourth sample.

14. The system according to claim 11, wherein the processing arrangement is further operable to:
   (k) determine if the second sample successfully loaded unto the stage of the second chamber, and
   (l) if item (k) produces an unsuccessful determination, prevent the irradiation of the second sample in until the second sample is successfully loaded unto the stage of the second chamber.

15. The system according to claim 9, wherein the processing arrangement is operable to redirect the beam pulses a beam redirecting arrangement which includes a beam reflection device.

16. The system according to claim 9, wherein the processing arrangement is further operable to:
   (m) determine if all of the at least one section of the first sample was successfully processed; and
   (n) if item (m) produces an unsuccessful determination, preventing the irradiation of the second sample until the processing of all of the at least one section of the first sample has been successfully processed.

* * * * *